United States Patent
Miyagi

(12) 
(10) Patent No.: US 6,498,504 B2
(45) Date of Patent: Dec. 24, 2002

(54) WAFER INSPECTION DEVICE AND WAFER INSPECTION METHOD

(75) Inventor: Yuji Miyagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/938,662

(22) Filed: Aug. 27, 2001

(65) Prior Publication Data

US 2002/0024355 A1 Feb. 28, 2002

(30) Foreign Application Priority Data

Aug. 28, 2000 (JP) ........................................ 2000-257851

(51) Int. Cl.[7] .............................................. G01R 31/02
(52) U.S. Cl. ........................................ 324/754; 438/14
(58) Field of Search ................................ 324/754, 158; 438/14; 339/17

(56) References Cited

U.S. PATENT DOCUMENTS 3,654,585 A * 4/1972 Wickersham
6,075,373 A * 6/2000 Iino ............................ 324/754
6,096,567 A * 7/2000 Russell ........................ 438/14

FOREIGN PATENT DOCUMENTS

JP 10-223704 8/1998

* cited by examiner

Primary Examiner—John F. Niebling
Assistant Examiner—Andre' C Stevenson
(74) Attorney, Agent, or Firm—Young & Thompson

(57) ABSTRACT

The wafer inspection device carries out inspection of a plurality of integrated circuits provided with a plurality of electrode pads, respectively, in a condition where the integrated circuits are formed on a wafer. The wafer inspection device is provided with a test head for outputting a test pattern from a plurality of tester pogo pins, a test board to which the tester pogo pins are connected, and a substrate. A plurality of contact pins that correspond to the tester pogo pins, respectively, and are arranged in a matrix form are provided on the test board. A plurality of first terminals, which are connected, respectively, to the plurality of electrode pads, are provided on a first main surface of the substrate. A plurality of second terminals, which comprise terminal groups for each integrated circuit, are provided on a second main surface of the substrate. The terminal groups are arranged in a matrix form, and the second terminals are connected to the contact pins for each terminal group. Furthermore, inner wiring that connects the first and second terminals is provided in the substrate.

7 Claims, 8 Drawing Sheets

WAFER INSPECTION DEVICE AND WAFER INSPECTION METHOD

BACKGROUND OF THE INVENTION

1. Field of the Invention

The present invention relates to a wafer inspection device and a wafer inspection method to be used for inspection of an integrated circuit mounted on a wafer, more particularly, a wafer inspection device and a wafer inspection method in which measuring efficiency is improved.

2. Description of the Related Art

Recently, to manufacture a semiconductor device, a process of inspection of operation of integrated circuits (ICs) formed on an Si wafer exists. FIG. 1A is a schematic view showing the arrangement of the ICs formed on an Si wafer, and FIG. 1B is a schematic view showing the positions of electrode pads provided on four ICs.

Generally, in a typical memory product, approximately 500 ICs are formed on an 8-inch wafer, however, for convenience, 108 ICs are shown in FIG. 1A. Also, approximately 60 electrode pads are provided on one IC, however, only 12 electrode pads 402 are shown in FIG. 1B.

Conventionally, on such a wafer 401, for example, 4 probes are arranged each horizontally and vertically, and 16 probe cards for measurement are used to output a test pattern from a test head to the ICs via a test board, and the results are detected by the test head, whereby the ICs are inspected one by one.

However, in such an inspection method, the probes are arranged horizontally and vertically in a square or rectangular matrix form, however, the ICs are closely provided as much as possible within the disk-shaped wafer 401 and arranged so as to be along the outer circumference of the wafer. Therefore, when ICs formed on one wafer 401 are inspected, all probes in the matrix arrangement cannot be contacted with the ICs. For example, in FIG. 1A, the probes come into contact with only the arrangement of indexes 1, 7, 8, 15, 16, 17, 25, 26, 27, and 28 of ICs, that is, the matrix of 16 probes comes into contact with 10 ICs, so that probes at positions where ICs do not exist are not used and remain unused. Such a loss frequently occurs at the outer circumferential portions of the wafer, so that a great loss occurs in the wafer measuring time, and reduction in the measuring time has been demanded.

Therefore, a device and a method by which all ICs formed on one wafer are collectively inspected have been disclosed (Japanese Unexamined Patent Publication No. H10-223704).

FIG. 2 is a schematic sectional view showing the conventional collective inspection device disclosed in Japanese Unexamined Patent Publication No. H10-223704. FIG. 3A is a sectional view showing the peripheral portion of projecting terminal 306 of FIG. 2, and FIG. 3B is a sectional view showing the peripheral portion of O-ring 325 of FIG. 2.

In this conventional collective inspection device, a chamber 300 into which a wafer 302 to be inspected is sealed and an arm 301 for conveying the wafer 302 into the chamber 300 are provided. In addition, a gate valve 304 is provided at the gateway of the arm 301 of the chamber 300, and gas a supply port 310 and a gas exhaust port 311 are provided at the upper part of the chamber 300.

Furthermore, at a lower part of the chamber 300, a ring-shaped position adjusting mechanism 305 is provided. An O-ring 325 is attached onto the position adjusting mechanism 305, and at the side more inner than the O-ring, a transparent contactor 307 is provided. As shown in FIG. 3A, projecting terminals 306 equal in number to the electrode pads 331 formed on the wafer 302 are formed on the upper surface of the contactor 307. On the other hand, connection terminals (not shown) equal in number to the projecting terminals 306 are formed on the lower surface of the contactor 307.

As shown in FIG. 3B, an exhaust passage making communication between the inside and the outside of the O-ring 325 is formed immediately under the O-ring 325 of the position adjusting mechanism 305, and is connected to tube 326 outside the O-ring 325. The tube 326 is connected to a vacuum pump (not shown) provided outside the chamber 300 via the exhaust passage formed in the chamber 300.

Furthermore, a test head 318 is disposed below the chamber 300, and on the test head 318, a connection ring 303 is connected via pogo pins 320. Connection terminals (not shown) equal in number to the connection terminals formed at the contactor 307 are formed on the upper part of the connection ring 303, however, the number of pogo pins 320 is approximately one tenth of the number of the connection terminals. Furthermore, a multiplexer (not shown) is installed inside the connection ring 303, and by this multiplexer, connection terminals from which signals inputted into the pogo pins 320 are outputted are switched.

In the conventional collective inspection device thus constructed, the wafer 302 is vacuum-adsorbed by the arm 301 and conveyed into the chamber 300. Then, when the center of the wafer 302 and the center of the contactor 307 almost coincide with each other in plane view, the arm 301 lowers until the wafer 302 comes into contact with the O-ring 325. When the wafer 302 comes into contact with the O-ring 325, the gate valve 304 is closed. Thereafter, heating or cooling gas is supplied from the gas supply port 310 into the chamber 300, and unnecessary gases are exhausted from the gas exhaust port 311. When the temperature inside the chamber 300 reaches a desired temperature, XY coordinates of the projecting terminal 306 and the electrode pad 331 are read through the transparent contactor 307 by an alignment mechanism (not shown), and based on this read data, the position of the contactor 307 is finely adjusted so as to coincide with the projecting terminal 306 by the position adjusting mechanism 305. After completing alignment, the space surrounded by the O-ring 325 via the exhaust passage and the like provided at the position adjusting mechanism 305 and chamber 300 is decompressed. Thereby, the O-ring 325 is collapsed, and the projecting terminal 306 comes into contact with the electrode pad 331. Thereafter, the chamber 300 is lowered, and the connection terminals formed on the lower surface of the contactor 307 and the connection terminals provided on the connection ring 303 are connected to each other.

Then, a test pattern is outputted from the test head 318 to the connection ring 303, is inputted into all electrode pads 331 of the wafer 302 from the predetermined connection terminals in order via the multiplexer, whereby inspection of each IC is conducted.

After completing the inspection, the chamber 300 rises to disconnect the connection terminals of the contactor 307 and the connection terminals of the connection ring 303, and then, the gate valve 304 is opened and the wafer 302 is carried out from the chamber 300 by the arm 301.

By such a conventional collective inspection device, theoretically, only switchover of signal lines by the multiplexer makes it possible to inspect all ICs.

However, the concrete construction of the multiplexer is not disclosed in the abovementioned patent publication, and at present, it is considered that production of the abovementioned multiplexers for thirty thousands electrode pads cannot be realized. Therefore, theoretically, inspection efficiency is improved by using the device disclosed in Japanese Unexamined Patent Publication No. H10-223704, however, in actuality, the problem of low inspection efficiency still remains, and the problem that unused contact pins exist also remains.

SUMMARY OF THE INVENTION

The object of the invention is to provide a wafer inspection device and a wafer inspection method by which inspection efficiency can be improved.

A wafer inspection device according to the present invention conducts inspection of a plurality of integrated circuits provided with a plurality of electrode pads respectively. The wafer inspection device comprises: a test head which outputs a test pattern from a plurality of tester pogo pins; a test board to which the tester pogo pins are connected, the test board having a plurality of contact pins that correspond to the tester pogo pins, respectively, and are arranged in a matrix form; and a substrate. The substrate has: a plurality of first terminals which are provided on a first main surface and are connected to the electrode pads, respectively; a plurality of second terminals which are provided on a second main surface and compose terminal groups for each of the integrated circuits, the terminal groups being arranged in a matrix form, and the second terminals are connected to the contact pins for each terminal group; and an inner wiring which connects the first terminals and second terminals.

In the present invention, all electrode pads provided on one integrated circuit are extended by the wiring provided in a substrate via the first terminals and connected to the second terminals having one terminal group. Therefore, when one contact pin is connected to one terminal group, inspection of one integrated circuit becomes possible. At this time, since the terminal groups are arranged in a matrix form on the second surface of the substrate, even in a case where an existing test board on which contact pins are provided in a matrix form is used, the contact pins can be connected to the terminal groups without leaving the pins unused, whereby inspection efficiency is improved. Furthermore, since it is not necessary that the coarse portion of the arrangement of the second terminals be provided on the second surface, by closely arranging the second terminals, the substrate can be made smaller than the wafer.

Moreover, by providing: a wafer holder on which the wafer is placed; a stage on which the wafer holder is placed; and a moving mechanism which moves the stage and the substrate independently of each other, to change the terminal groups connected to the contact pins, only the substrate made smaller than the wafer may be moved by a necessary amount, so that the moving time can be shortened.

In addition, by providing: a supporting member which surrounds and supports the substrate; an airtight mechanism provided below the supporting member and forming an airtight chamber between the substrate, supporting member, and wafer holder when being contacted with the wafer holder; and a decompressing apparatus which decompresses the air pressure inside the airtight chamber to contact the wafer holder to the supporting member, independent movements of the stage and the substrate can be easily realized.

The wafer inspection device may further comprise an evacuating apparatus which fixes the wafer to the wafer holder until the decompressing apparatus operates.

According to the present invention, capital investment can be suppressed. Furthermore, by moving the substrate, inspection of all integrated circuits can be carried out. Therefore, the time to switch the integrated circuits to be inspected can also be shortened.

According to another aspect of the present invention, a wafer inspection method using the above-described wafer inspection device comprises the step of carrying out repeatedly replacement of terminal groups to be connected to the contact pins.

DETAILED DESCRIPTION OF THE PREFERRED EMBODIMENTS

Figure 4:
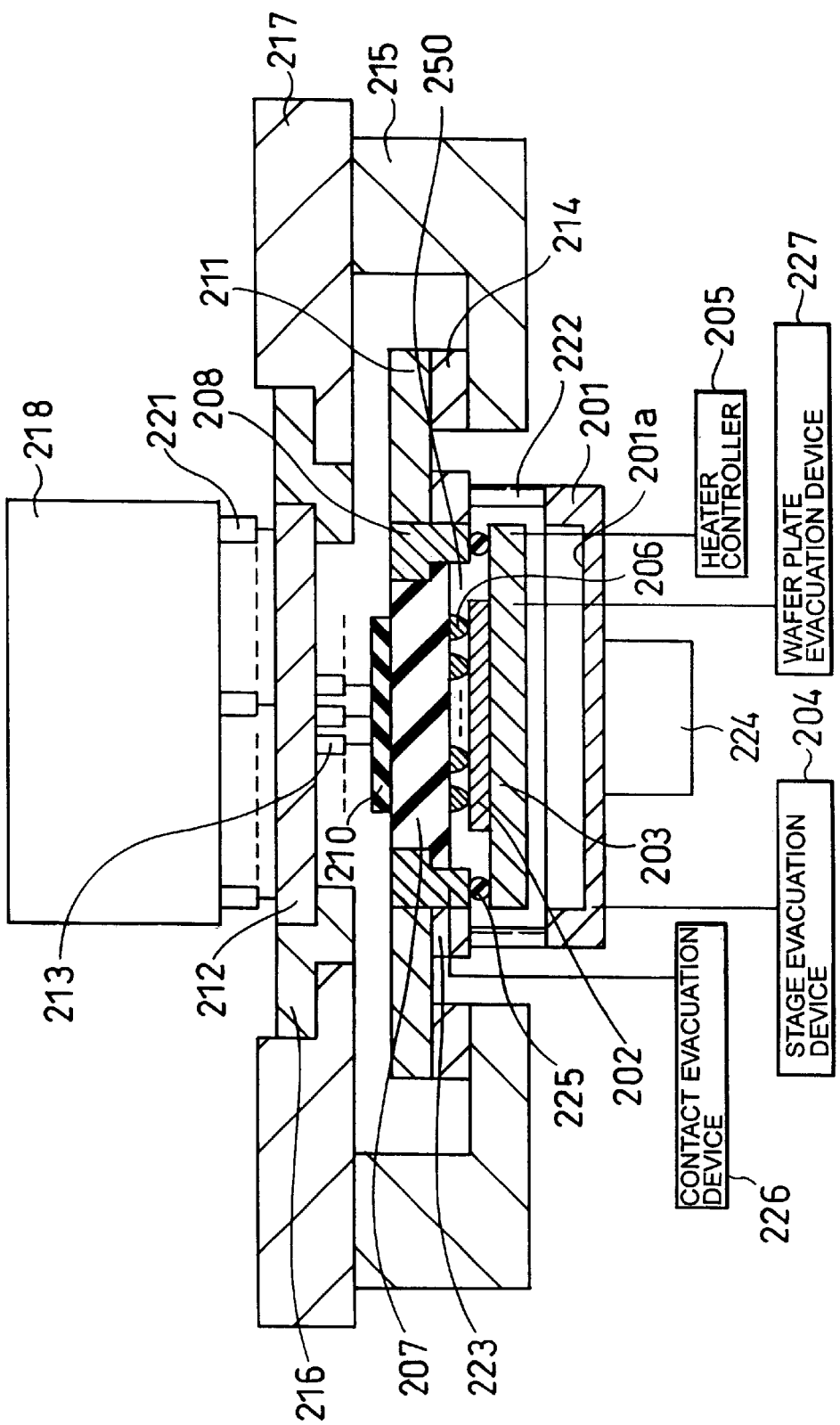
FIG. 4 is a sectional view showing a wafer inspection device according to an embodiment of the present invention.
Figure 5:
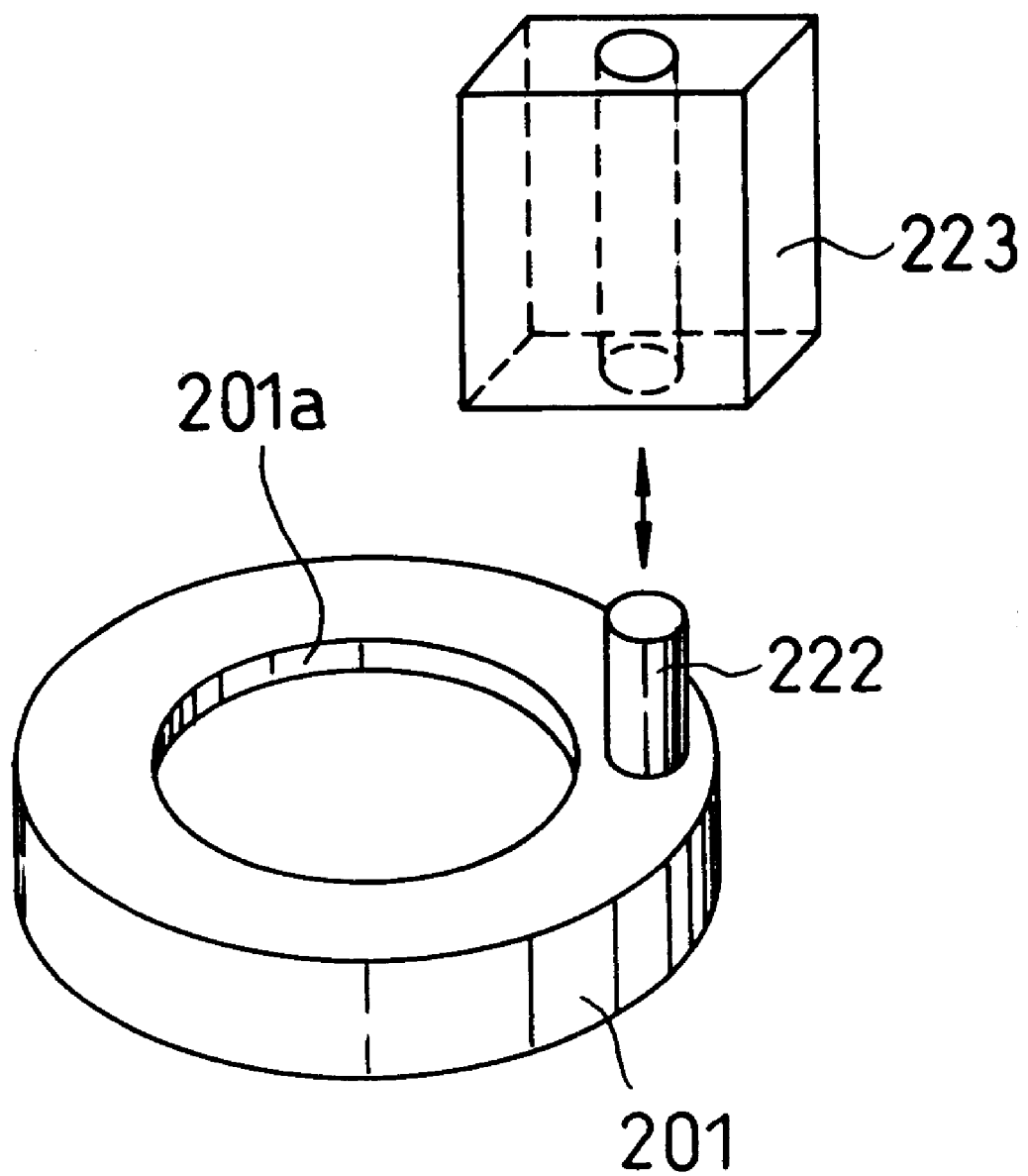
FIG. 5 is a schematic view showing the relationship between guide post 222 and guide block 223 shown in FIG. 4.

Hereinafter, a preferred embodiment of the present invention is explained in detail with reference to the attached drawings. FIG. 4 is a sectional view of a wafer inspection device according to an embodiment of the present invention. FIG. 5 is a schematic view showing the relationship between a guide post 222 and a guide block 223 shown in FIG. 4.

In the present embodiment, a wafer plate 203, on which a wafer 202 is placed, is provided. In addition, a stage 201 with a concave portion 201a having the shape of the wafer plate 203 formed on the surface is provided. Below the stage 201, an XYZθ driving portion 224 is provided, which can reciprocate the stage 201 in two horizontal directions (X and Y directions) orthogonal to each other and in the vertical direction (z direction) and rotate the stage in the circumferential direction (θ direction). On the other hand, around the concave portion 201a of the stage 201, a plurality of guide posts 222 extend upward. Above each of the guide post 222, as shown in FIG. 5, a guide block 223 with a hole made for insertion of the guide post 222 is provided. At the side more inner than the guide block 223, a contactor holder 208 for supporting a contactor 207 to be used for inspection of the wafer 202 is provided. An O-ring 225 is attached onto the lower surface of the contactor holder 208.

In addition, on the guide blocks 223, an XY slider 211 for guiding the guide blocks 223 in the XY directions by an air bearing is provided, and furthermore, a Z slider 214 for guiding the XY slider 211 in the Z direction is provided. Furthermore, the contactor holder 208 is fixed to the XY slider 211. On the Z slider 214, an elevation device (not shown) for raising and lowering the XY slider 211 and a lock mechanism (not shown) for fixing the height of the XY slider 211 are provided. In addition, slider supporting portion 215 is provided to support the Z slider 214.

Furthermore, in the inspection device according to the present embodiment, a test board holder 216 for supporting a test board 212 and a head plate 217 for supporting the test board holder 216 are provided. A slider supporting portion 215 is fixed to this head plate 217. On the lower surface of the test board 212, for example, 16 total contact pins 213 arranged four each horizontally and vertically are provided, and connected to the pogo seats (not shown in FIG. 1) provided on the surface of the arranging substrate 210 attached to the contactor holder 208 for each IC. On the upper surface of the test board 212, mounting parts such as pogo seats (not shown) for strengthening the power supply and ground (GND), circuit resistor, capacitor, and the like are provided in accordance with the contact pins 213, and to the upper surface, the tester pogo pins 221 provided on the test head 218 are connected.

A stage evacuation device 204 for suctioning the wafer plate 203 into the concave portion 201*a* is provided on the stage 201, a wafer plate evacuation device 227 for suctioning the wafer 202 is provided on the wafer plate 203, and a contact evacuation device 226 for decompressing the inside of the space surrounded by the O-ring 225 is provided on the contactor holder 208. Furthermore, a heater (not shown) is installed inside the wafer plate 203, and a heater controller 205 is connected to this heater.

Figure 6A:
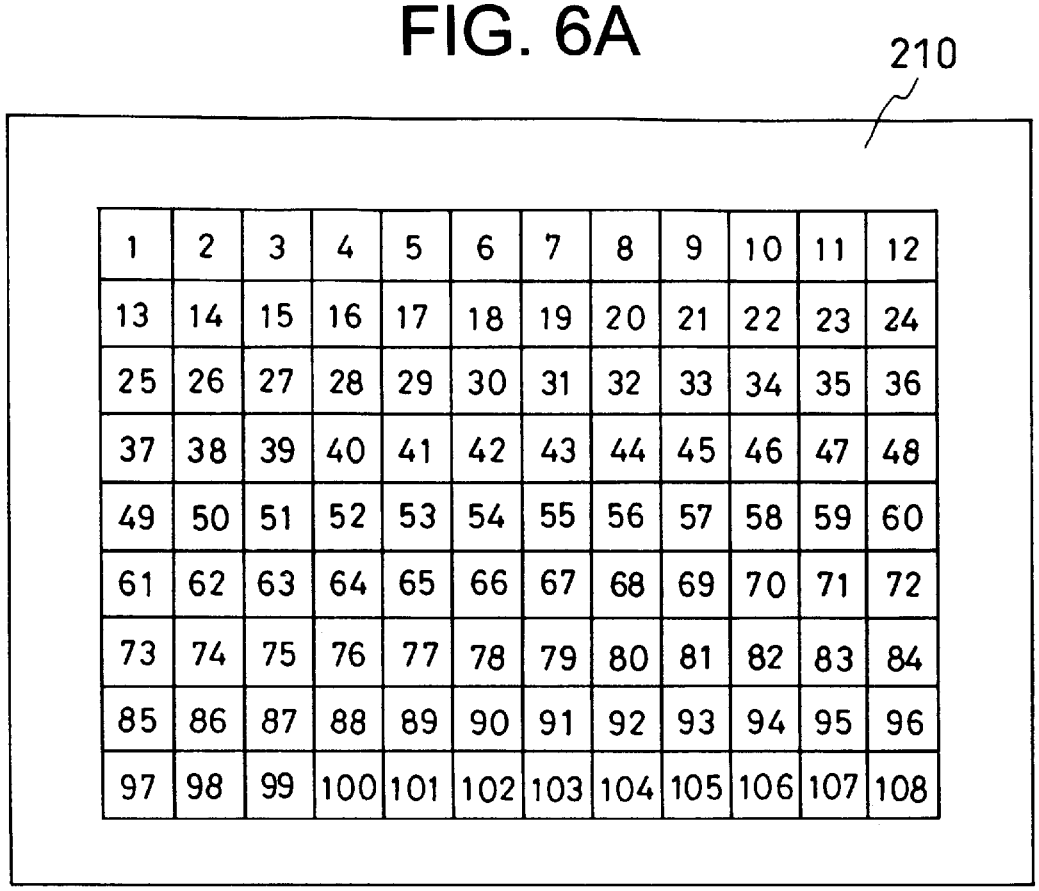
FIG. 6A is a schematic view showing the arrangement of pogo seat groups formed on an arranging substrate 210.
Figure 6B:
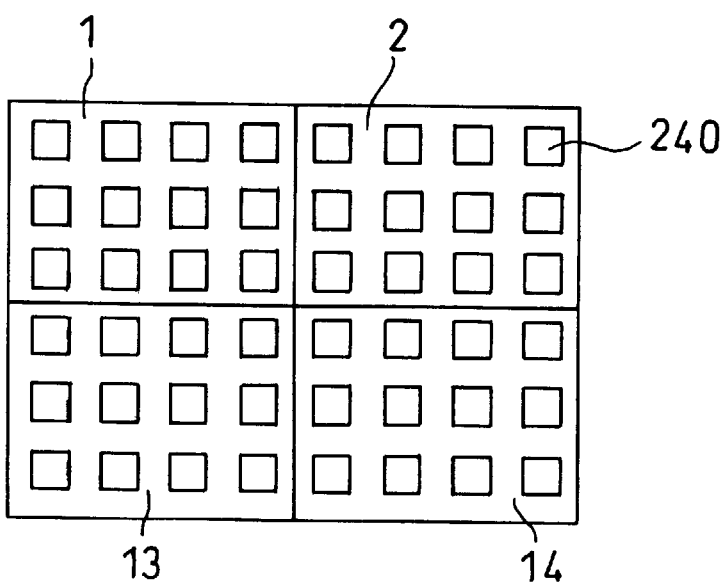
FIG. 6B is a schematic view showing the positions of the pogo seats provided on four pogo seat groups.

FIG. 6A is a schematic view showing the arrangement of the pogo seat groups formed on the arranging substrate 210, and FIG. 6B is a schematic view showing the positions of the pogo seats provided on four pogo seat groups.

Figure 1A:
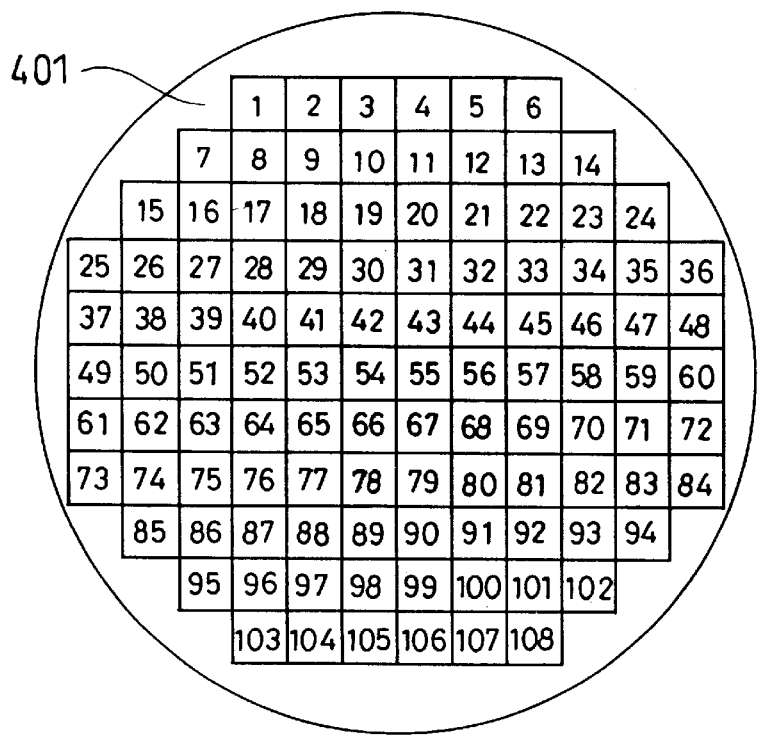
FIG. 1A is a schematic view showing the arrangement of ICs formed on an Si wafer.
Figure 1B:
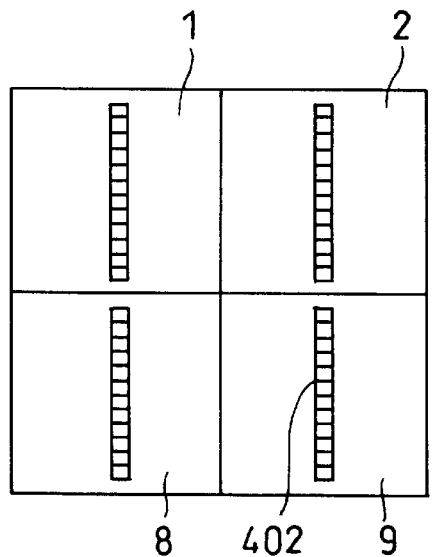
FIG. 1B is a schematic view showing the positions of the electrode pads provided on the four ICs.
Figure 2:
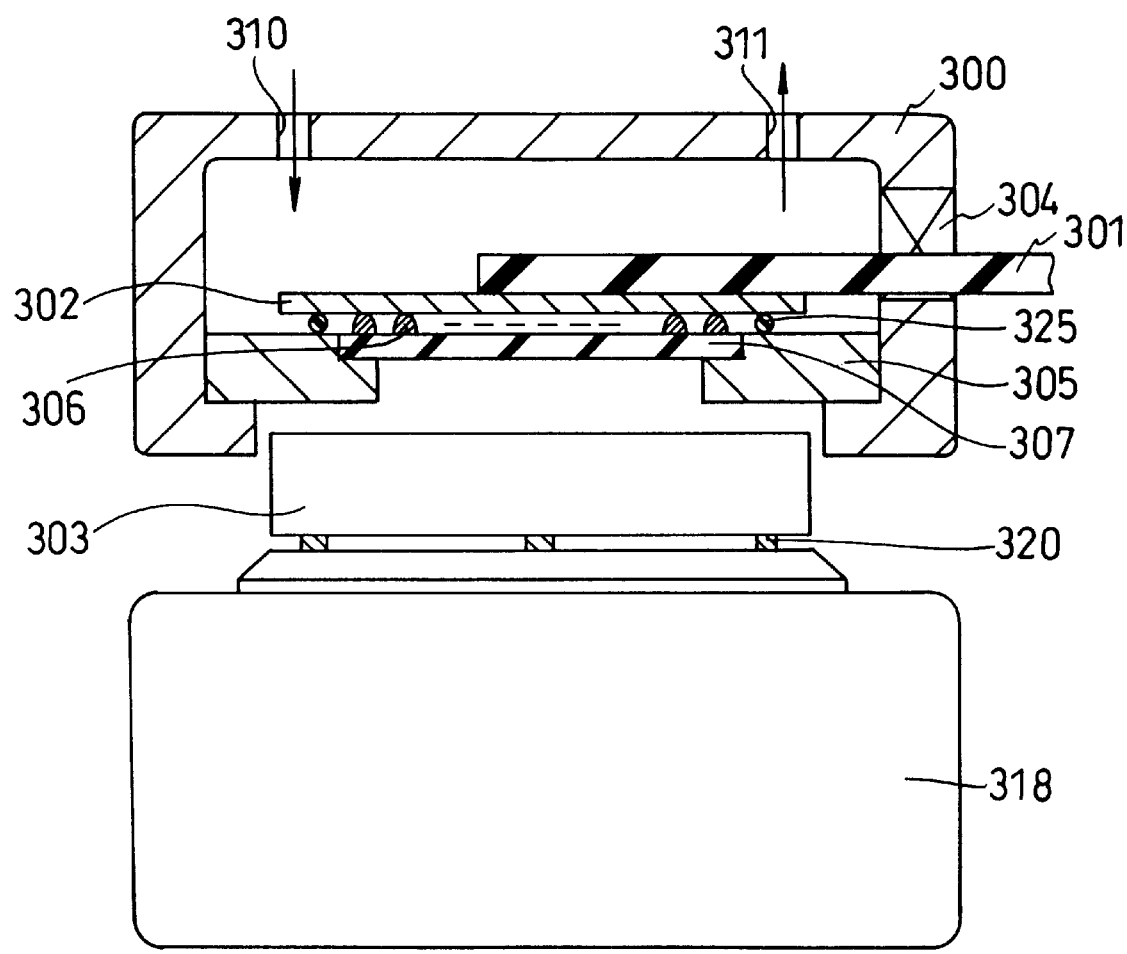
FIG. 2 is a schematic sectional view showing a conventional collective inspection device disclosed in Japanese Unexamined Patent Publication No. H10-223704.
Figure 3A:
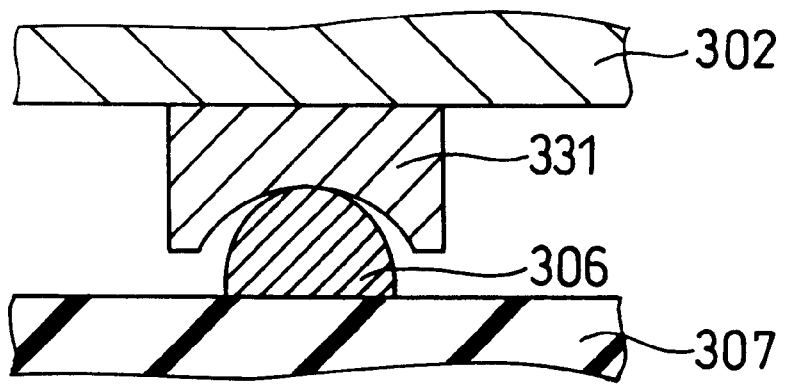
FIG. 3A is a sectional view showing a peripheral portion of a projecting terminal 306 shown in FIG. 2.
Figure 3B:
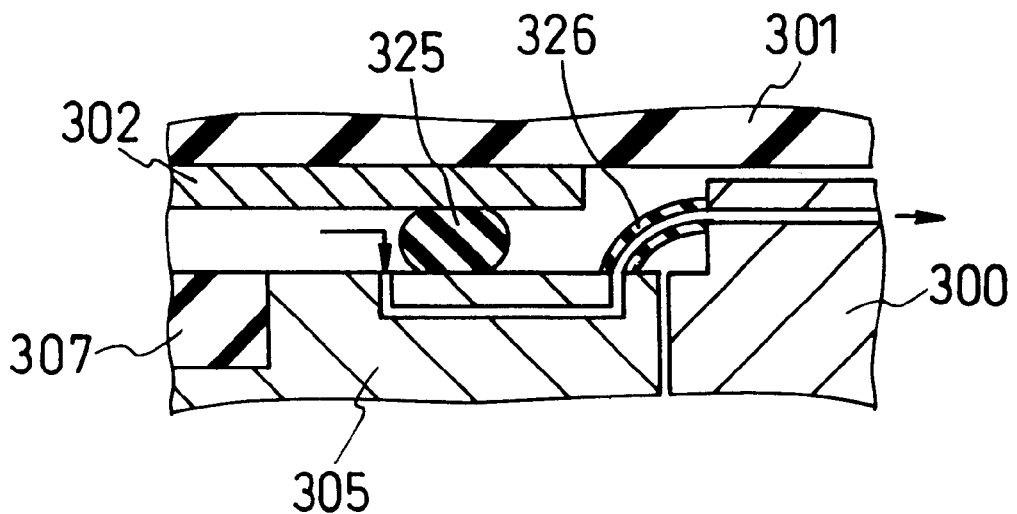
FIG. 3B is a sectional view showing a peripheral portion of an O-ring 325 shown in FIG. 2.

The pogo seat groups are formed equal in number to ICs formed on the wafer 202, for example, 500, and on each pogo seat group, pogo seats equal in number to the electrode pads provided on each IC, for example, 60 pogo seats are provided, however, in order to make FIG. 1A and FIG. 1B consistent with each other, 108 pogo seat groups are shown in FIG. 6A, and 12 pogo seats provided on one pogo seat group are shown in FIG. 6B.

As shown in FIG. 6A, in the present embodiment, 9 pogo seat groups are arranged vertically, and 12 pogo seat groups are arranged horizontally, that is, 108 pogo seat groups, the same number as that of ICs, are formed on the arranging substrate 210. Furthermore, as shown in FIG. 6B, the pogo seats are arranged by three vertically and four horizontally, that is, 12 pogo seats 240 are provided on one pogo seat group. Therefore, by using one pogo seat group, inspection of one IC can be carried out.

Figure 7:
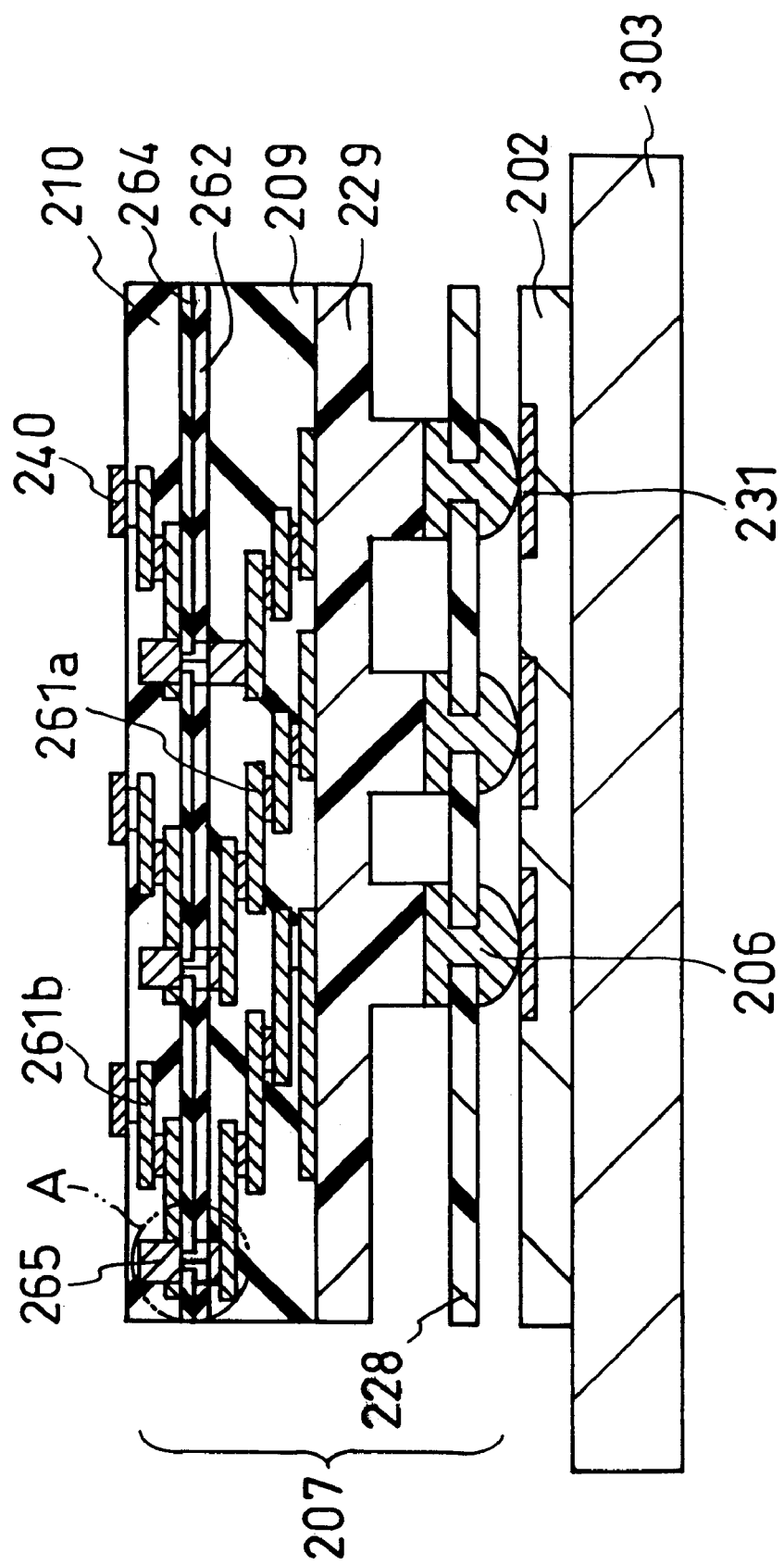
FIG. 7 is a sectional view showing the details of a contactor 207 and an arranging substrate 210.
Figure 8:
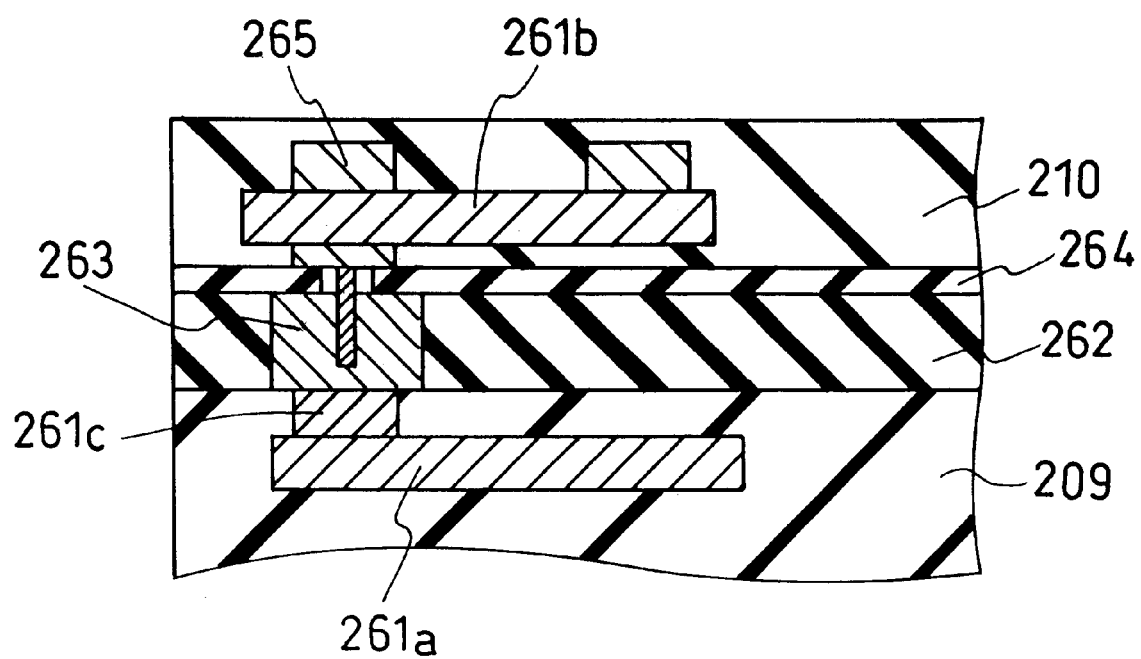
FIG. 8 is a sectional view showing the details of a surrounding of an area A shown in FIG. 7.

FIG. 7 is a sectional view showing details of the contactor 207 and the arranging substrate 210, and FIG. 8 is a sectional view showing details around the area A of FIG. 7.

In the contactor 207, a base 229 made of an anisotropic conductive rubber is provided, and projecting terminals 206 attached to the probe substrate 228 are connected to the lower ends of the base 229. The projecting terminals 206 are provided, as mentioned above, equal in number to the electrode pads 231 formed on the wafer 202. A relay substrate 209 is provided on the base 229. The relay substrate 209 may be a multilayer substrate having an inner layer pattern 261*a* including about 20 layers, and on the upper part thereof, a contact layer 262 for filling silver paste 263 is formed. The silver paste 263 is provided on the uppermost inner layer pattern 261*c*. Furthermore, cover a substrate 264 for preventing leakage of the silver paste 263 is provided on the contact layer 262, and an arranging substrate 210 is provided on the contact layer 262.

The arranging substrate 210 may be a multilayer substrate having an inner layer pattern 261*b*, and pogo seats 240 arranged as shown in FIG. 6B are formed on the upper surface of this substrate. Furthermore, pins 265 extended to the inside of the silver paste 263 are formed at the extremely lower layer portion.

It is preferable that the length of wiring connected from the projecting terminal 206 to the pogo seat 240 via the inner layer patterns 261*a*, 261*c*, and 261*b* is fixed between the projecting terminals and pogo seats.

Next, an inspection method using the wafer inspection device of the present embodiment thus constructed is explained.

First, the wafer plate 203 is housed inside the concave portion 201*a* of the stage 201 by a loader (not shown), the stage evacuation device 4 is operated to adsorb the wafer plate 203, and in a condition where the wafer plate 203 is fixed inside the concave portion 201*a*, the wafer 202 is placed on the wafer plate 203. Next, the wafer plate evacuation device 227 is operated to suction the wafer 202, whereby the wafer 202 is fixed to the wafer plate 203.

Then, by an image recognition device (not shown), the position of the wafer 202 is detected via an alignment mark or the like and the position data is saved. Next, the projecting terminals 206 provided on the contactor 207 or the position of the alignment mark provided at a predetermined position is detected, and deviation from the position of the wafer 202 is calculated. Then, based on this calculation result, the XYZθ driving portion 224 is operated to carry out alignment so as to eliminate the deviation.

Subsequently, the stage 201 is raised by the XYZθ driving portion 224. When the stage 201 rises, the guide post 222 is inserted into the guide block 223 from a predetermined height, and thereafter, the upper surface of the wafer plate 203 comes into contact with the O-ring 225. As a result, a space 250 surrounded by the contactor holder 208, contactor 207, wafer plate 203, and O-ring 225 is generated around the wafer 202.

Next, the stage evacuation device 204 is stopped to release fixation of the wafer plate 203 to the stage 201, and the contact evacuation device 226 is actuated. As a result, the space 250 is decompressed, and wafer plate 203 is raised up while the O-ring 225 is pressed and collapsed, whereby the projecting terminals 206 of the contactor 207 and the electrode pads 231 on the wafer 202 are connected to each other with a proper load. In this condition, the electrode pads 231 on the wafer 202 are connected to the pogo seats 240 provided on the upper surface of the arranging substrate 210.

Thereafter, the contact pins 213 disposed on the lower surface of the test board 212 are connected to the pogo seat groups on the arranging substrate 210. An existing test board may be used as the test board 212, and the contact pins 213 are provided four each horizontally and vertically, that is, 16 total contact pins 213. In this case, the contact pins 213 can be connected to, among the pogo seat groups shown in FIG. 6A, for example, pogo seat groups at the pogo seat arranging positions 1 through 4, the pogo seat arranging positions 13 through 16, the pogo seat arranging positions 25 through 28, and the pogo seat arranging positions 37 through 40. At this time, the horizontal position of the arranging substrate 210 must be adjusted, and the lock mechanism of the Z slider 214 is released, the XY slider 211 and arranging substrate 210 are lowered to the extremely lower point by the elevation device, whereby a space is generated between the contact pins 213 and the arranging substrate 210. Then, the contactor 207 and arranging substrate 210 are moved horizontally and positioned while being guided by the slider 211 by the XYZθ driving portion 224, and then the arranging substrate 210 is raised by the elevation device to connect the pogo seats 240 to the contact pins 213, and the lock mechanism of the Z slider 214 is fixed.

Next, the tester pogo pins 221 of the test head 218 are connected in advance to pogo seats (not shown) provided on the upper surface of the test board 212, and a test pattern is inputted from the test head 218 into, for example, 16 ICs to carry out inspection.

After the inspection of 16 ICs is completed, the lock mechanism of the Z slider 214 is released, the arranging substrate 210 is lowered to the extremely lower point by the elevation device, and the arranging substrate 210 is moved horizontally again by the XYZθ driving portion 224, whereby, for example, the pogo seat group arranging positions 5 through 8, the pogo seat group arranging positions 17 through 20, the pogo seat group arranging positions 29 through 32, and the pogo seat group arranging positions 41 through 44 are arranged immediately under the contact pins 213. Then, 16 ICs are inspected via these pogo seats, and the same movement and inspection are repeatedly carried out in order. For example, the inspection is carried out by heating the wafer 202 by the heater installed inside the wafer holder 203 by the heater controller 205.

After inspection of all ICs is completed, the stage 201 is raised close to the wafer plate 203 by the XYZθ driving portion 224, and thereafter, operation of the contact evacuation device 226 is stopped, and gases are supplied into the space 250 so that the pressure inside the space reaches the pressure of the atmosphere. As a result, the electrode pads 231 are separated from the projecting terminals 206, and the wafer plate 203 is separated from the O-ring 225 due to its weight, and falls to the inside of the concave portion 201a of the stage 201. However, the distance of this fall is extremely short so that the ICs are not damaged by this fall.

Thereafter, the wafer plate evacuation device 227 also stops to release the wafer 202 from restraint by the wafer plate 203, and the wafer is returned to the loader and replaced with the next wafer. Then, the abovementioned inspection is repeatedly carried out while replacing the wafer.

By such a wafer inspection method using the inspection device according to the present embodiment, as shown in FIG. 6A, since pogo seat groups are arranged in a rectangular form, all contact pins 213 can be connected to the pogo seat groups for inspection of any ICs, and therefore, inspection efficiency is improved. In addition, as shown in FIG. 1B, in many cases, the electrode pads are collectively provided at the central portion or peripheral portion of the wafer, so that coarse portion of the arrangement of electrode pads exists. However, on the arranging substrate 210 in the present embodiment, as shown in FIG. 6B, the pogo seats 240 can be arranged at equal intervals and at a fixed density, so that the arranging substrate 210 can be made extremely small in comparison with the wafer 202. As a result, the horizontal moving distance of the arranging substrate 210 in a case where the connection destinations of the contact pins are changed becomes short, so that the time required for the inspection can also be reduced.

In the abovementioned embodiment, the base 209 made of an anisotropic conductive rubber is provided in the contactor 207, however, pogo pins may be provided on the base 209.

Furthermore, the number of contact pins is not limited to 16, and it may be 2, 4, 8, 32, 64 or the like.

What is claimed is:

1. A wafer inspection device for conducting inspection of a plurality of integrated circuits provided with a plurality of electrode pads, respectively, comprising:

a test head which outputs a test pattern from a plurality of tester pogo pins;

a test board to which said tester pogo pins are connected, said test board having a plurality of contact pins that correspond to the tester pogo pins, respectively, and are arranged in a matrix form; and a substrate having:
      a plurality of first terminals which are provided on a first main surface and are connected to said electrode pads, respectively;
      a plurality of second terminals which are provided on a second main surface and compose terminal groups for each of said integrated circuits, said terminal groups being arranged in a matrix form, and said second terminals being connected to said contact pins for each terminal group; and
      an inner wiring which connects said first terminals and second terminals.

2. The wafer inspection device according to claim 1, further comprising:

a wafer holder on which a wafer to which said plurality of integrated circuits are formed is placed;

a stage on which said wafer holder is placed; and a moving mechanism which moves said stage and said substrate independently of each other.

3. The wafer inspection device according to claim 2, further comprising:

a supporting member which surrounds and supports said substrate;

an airtight mechanism provided below said supporting member and forming an airtight chamber between said substrate, supporting member, and wafer holder when being contacted with said wafer holder; and a decompressing apparatus which decompresses the air pressure inside said airtight chamber to contact said wafer holder to said supporting member.

4. A wafer inspection device according to claim 1, further comprising an evacuating apparatus which fixes said wafer to said wafer holder until said decompressing apparatus operates.

5. A wafer inspection device according to claim 2, further comprising an evacuating apparatus which fixes said wafer to said wafer holder until said decompressing apparatus operates.

6. A wafer inspection device according to claim 3, further comprising an evacuating apparatus which fixes said wafer to said wafer holder until said decompressing apparatus operates.

7. A wafer inspection device according to claim 1, wherein said second terminals are arranged substantially at equal intervals.

* * * * *